(12) United States Patent
Dark et al.

(10) Patent No.: US 6,563,189 B1
(45) Date of Patent: *May 13, 2003

(54) METHOD OF ADDING ZENER ZAP ALUMINUM BRIDGED ANTI-FUSES TO A TUNGSTEN PLUG PROCESS

(75) Inventors: Charles Dark, Arlington, TX (US); William M. Coppock, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/875,565

(22) Filed: Jun. 6, 2001

(51) Int. Cl.[7] ............................................... H01L 29/04
(52) U.S. Cl. ........................ 257/530; 257/50; 438/131
(58) Field of Search ........................... 257/50, 529, 530

(56) References Cited

U.S. PATENT DOCUMENTS

| 5,272,666 A | * | 12/1993 | Tsang et al. ................ 257/530 |
| 5,329,153 A | * | 7/1994 | Dixit ........................... 257/530 |
| 5,648,678 A | * | 7/1997 | Begley et al. ............... 257/530 |
| 6,440,781 B1 | * | 8/2002 | Coppock et al. ............ 257/530 |

OTHER PUBLICATIONS

Donald T. Comer, "Zener Zap Anti–Fuse Trim in VLSI Circuits", VLSI Design, 1996, vol. 5, No. 1, pp. 89–100.

* cited by examiner

Primary Examiner—Gene M. Munson
(74) Attorney, Agent, or Firm—Stallman & Pollock LLP

(57) ABSTRACT

The present invention provides a two-terminal Zener zap diode device structure that relies upon the formation of an anti-fuse through a silicon substrate with the melting and flow of an aluminum alloy to create the current path. The use of oversized contacts in the diode structure permits the Tungsten plug to be eliminated from the diode structure and, thus, permits an aluminum alloy melt and flow mechanism to be used with a Tungsten plug process.

10 Claims, 4 Drawing Sheets

US 6,563,189 B1

METHOD OF ADDING ZENER ZAP ALUMINUM BRIDGED ANTI-FUSES TO A TUNGSTEN PLUG PROCESS

BACKGROUND OF THE INVENTION

1. Field of the Invention

The present invention relates to semiconductor integrated circuits and, in particular, to a no cost technique for adding Zener zap diode aluminum bridged anti-fuse trim to a Tungsten plug process for fabricating integrated circuit structures.

2. Discussion of the Related Art

Zener zap diode anti-fuses, which depend upon bias direction to create the anti-fuse mechanism, are typically applied to processes with an interconnect of aluminum, aluminum alloy only, or an aluminum alloy with a barrier metal. An overview of Zener zap diode anti-fuse trim is presented by D. T. Comer, "Zener Zap Anti-Fuse Trim in VLSI Circuits," VLSI Design, 1996, Vol. 5, No. 1, pp. 89–100.

However, when Tungsten interconnect processes are used, the aluminum melt and flow mechanism that Zener zap diodes rely upon is blocked. The blocking feature is the Tungsten plug itself.

Thus, there is a need for a Zener zap anti-fuse mechanism that is utilizable in a Tungsten plug process.

SUMMARY OF THE INVENTION

The present invention provides a two-terminal Zener zap diode device that relies upon the formation of an anti-fuse through the silicon substrate. This is accomplished by the melting and flowing of an aluminum alloy through the diode to create a permanent conduction path. The use of an oversized contact permits the Tungsten plug to be eliminated from the diode structure and, thus, permits restoration of the aluminum/aluminum alloy conduction path, allowing the aluminum/aluminum alloy melt and flow mechanism to be used with a Tungsten plug process. The elimination of the Tungsten plug from the diode structure could be accomplished with a separate mask and etch step, but that would require extra processing and added cost. The technique of the present invention requires no additional processing.

As used in this document, the term "oversized contact" is defined as a contact where the width of the contact is greater than two times the Tungsten deposition thickness. Clearly, for proper Tungsten plugs to be formed, the dimension must be less than two times the Tungsten thickness for the plug to fill properly without a center void. When the contact width is greater than two times the Tungsten thickness, the Tungsten etchback will penetrate the seam area and, if the width is large enough, the Tungsten will be removed from the contact bottom in the same manner that it is removed from the open area on the wafer.

The features and advantages of the present invention will be more fully appreciated upon consideration of the following detailed description of the invention and the accompanying drawings, which set forth an illustrative embodiment in which the principles of the invention are utilized.

DETAILED DESCRIPTION OF THE INVENTION

The disclosed embodiment of the present invention, illustrated in FIGS. 1A–1F, is directed to a two-terminal integrated circuit Zener zap diode structure.

Figure 1A:
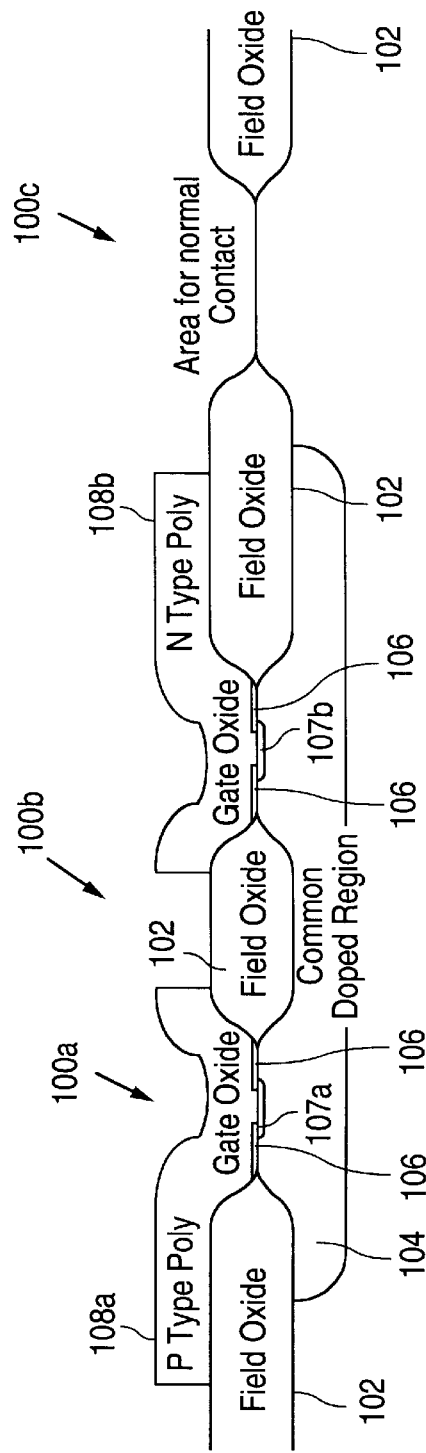
FIGS. 1A–1F provide a sequence of partial cross-section drawings illustrating a method of adding bias-independent aluminum bridged anti-fuses to a tungsten plug process in accordance with the concepts of the present invention.

As shown in FIG. 1A, the two terminals regions 100a and 100b are separated by field oxide 102, but are formed over a common doped region 104, which may be either N-type or P-type conductivity.

Gate oxide 106 is grown over the two terminal regions 100a, 100b. A third contact region 100c will receive a standard Tungsten plug process contact, as discussed in greater detail below. This third standard contact is not part of the device and is provided for reference only. The gate oxide 106 in terminal regions 100a and 100b is etched open during conventional integrated circuit fabrication processing.

As further shown in FIG. 1A, a standard polysilicon layer is grown over the two contact regions 100a and 100b and patterned using conventional photolithographic techniques to provide polysilicon regions 108a and 108b. One of the poly contacts should be P-type (i.e contact 108a in FIG. 1A) and the other should be N-type (i.e. contact 108b in FIG. 1A). The silicon area 107a, 107b directly under the poly contacts 108a, 108b, respectively, will take on the dopant characteristics of the polysilicon above the contact. One of these polysilicon doped regions will be at the same dopant as the common doped region 104, while the silicon area under the other region will take on the doping characteristics of the other polysilicon region, which will be the opposite doping type. This structure creates the Zener Zap diode that will become the anti-fuse. Each poly conductor 108a, 108b extends up onto the field oxide 102 to reduce subsequent metallization step coverage requirements, although this may not be required in all applications. Further, the polysilicon regions 108a, 108b can be silicided, but this is also not required.

As stated above, the third contact region 100c, which is not a part of the Zener zap circuit, and is provided for reference only, will receive a standard Tungsten plug contact and may be silicided, salicided or neither as necessary for a particular application.

Figure 1B:
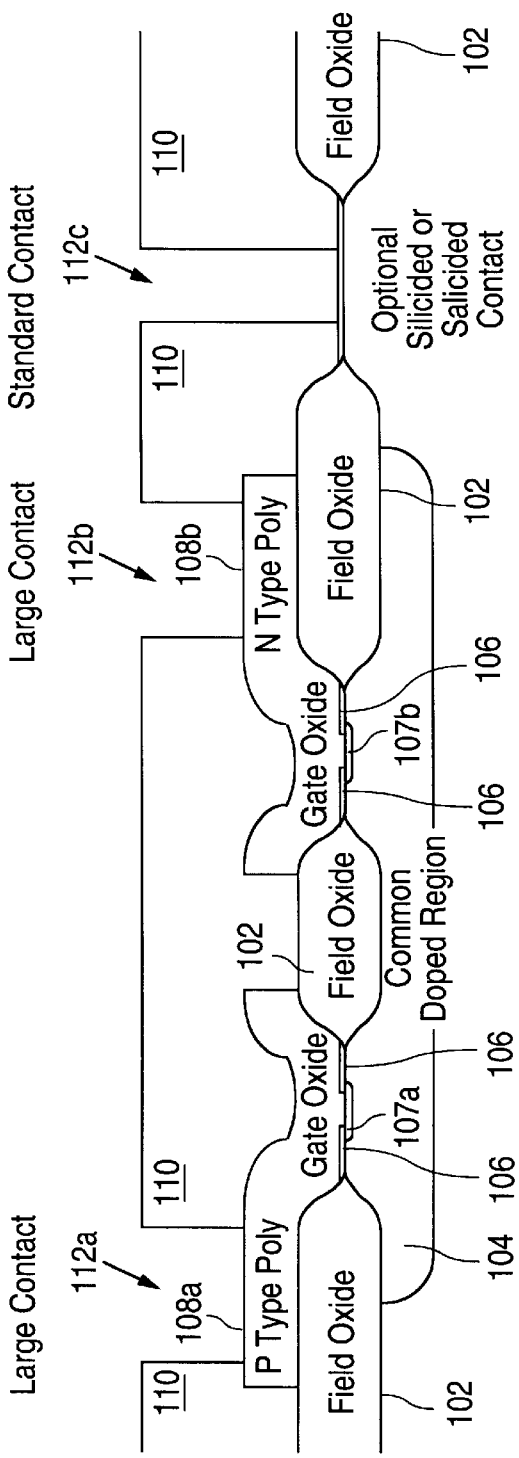

Referring to FIG. 1B, a first insulating dielectric layer 110, typically silicon dioxide, is deposited according to conventional techniques. Oversized contact openings 112a and 112b are then cut to the two polysilicon regions 108a and 108b, respectively. As mentioned above, these oversized contact openings 112a, 112b are made to the polysilicon regions 108a, 108b over the field oxide 102 to reduce aluminum alloy metallization step coverage issues, but those skilled in the art will appreciate that contact directly over the gate may be allowed if the aluminum alloy metal thickness is sufficient.

As further shown in FIG. 1B, a standard sized Tungsten plug contact opening 112c is made to the reference contact region 100c.

Figure 1C:
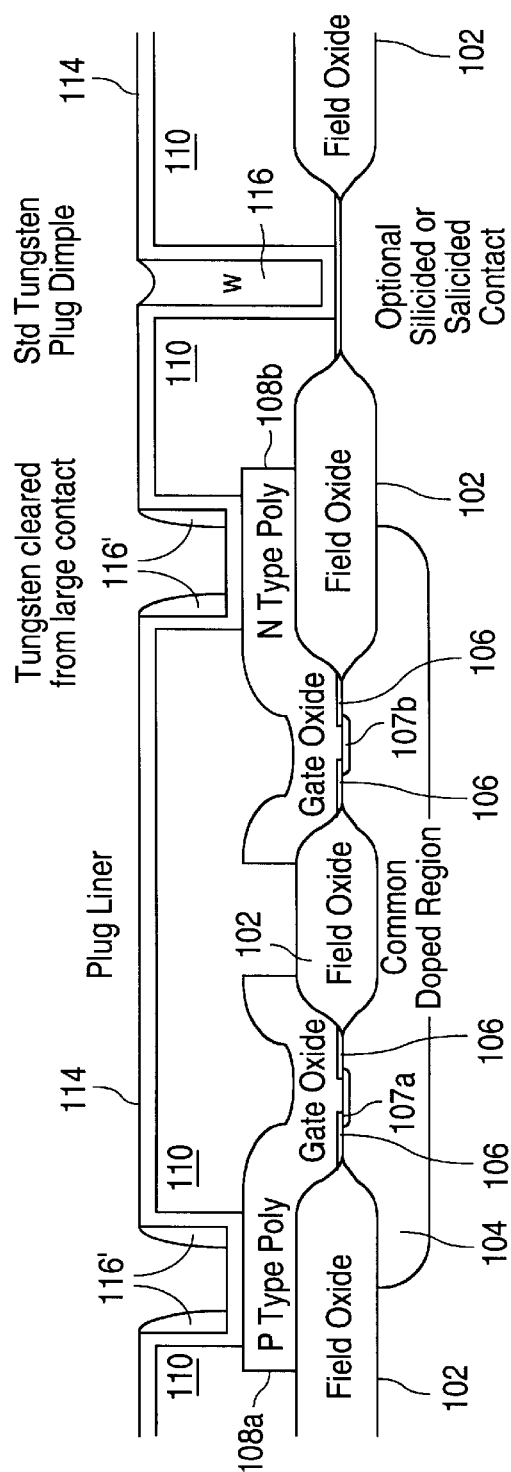

Referring to FIG. 1C, a layer of titanium nitride (TiN) plug liner material 114 (or other suitable plug liner material) and Tungsten (W) are then deposited in accordance with conventional techniques. An anisotropic Tungsten etch back process etches the standard sized Tungsten plug 116 in the reference contact region 100c in the typical manner, stopping with a small dimple remaining on the top of plug 116. The etchback results in all Tungsten being cleared from the oversized contact openings 112a and 112b in the same way that the Tungsten is cleared from the open areas. However, as illustrated in FIG. 1C, small residual Tungsten spacers 116' may remain at the edges of the large contact openings 112a, 112b; these spacers 116' are of no consequence. The Tungsten etchback process will also leave the polysilicon regions 108a, 108b undamaged, since the process is a Stop On TiN (SOT) technique, i.e. the Tungsten etchback stops on the TiN liner layer 114.

Figure 1D:
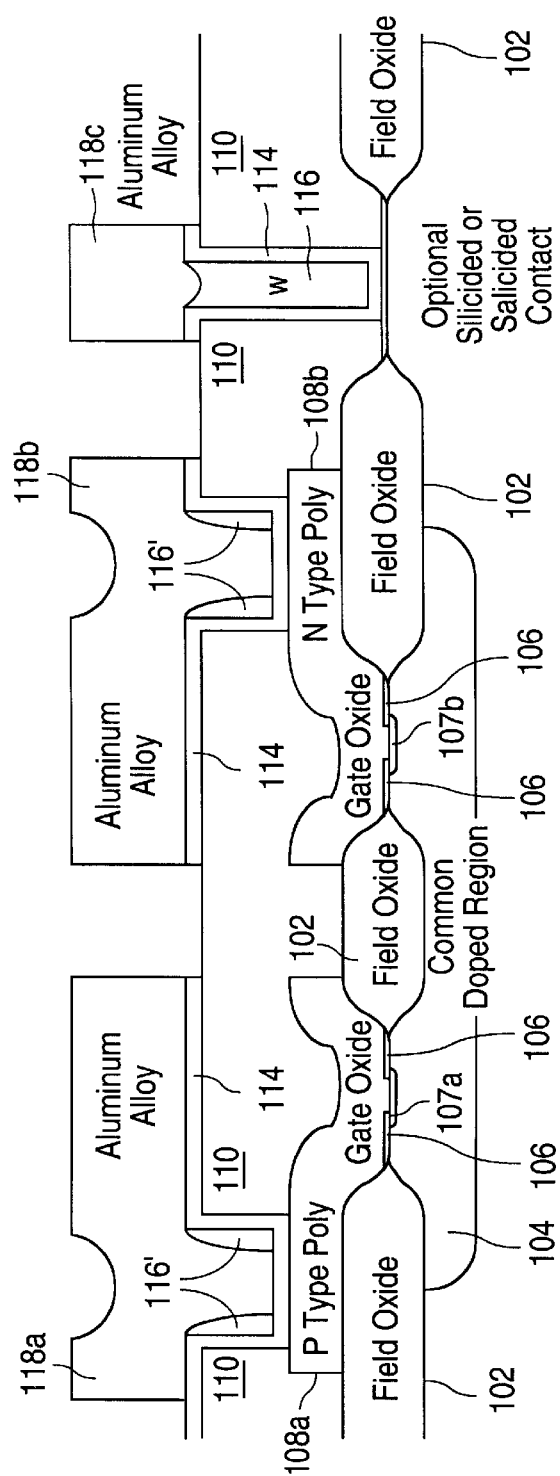

FIG. 1D shows a standard aluminum slab Metal 1 process in which a first aluminum layer is deposited according to conventional techniques and then masked and etched to provide aluminum oversized contacts 118a and 118b to polysilicon regions 108a and 108, respectively.

Figure 1E:
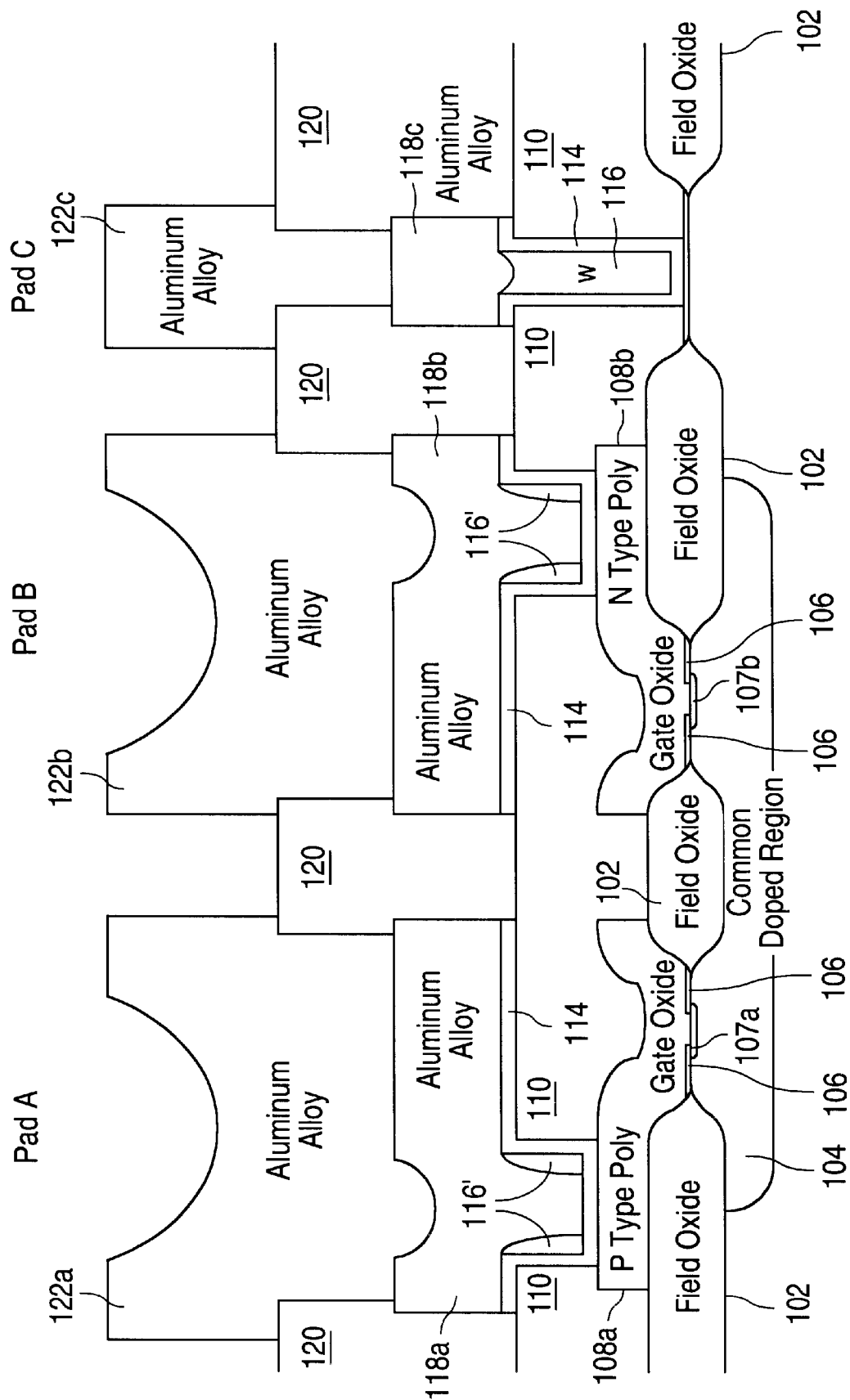

Referring to FIG. 1E, a second layer of dielectric material 120, typically silicon dioxide, is then deposited and patterned to provide vias for a Metal 2 deposition and etch. If an aluminum alloy only process is used for Metal 2, then the vias can be standard sized, or they can also be oversized vias similar to the oversized contact process described above. If the Metal 2 uses a Tungsten plug, then the Metal 2 process can be set up as a standard Tungsten plug. In any event, the procedure results in the formation of aluminum contacts 122a, 122b and 122c to aluminum alloy Metal 1 contact regions 118a, 118b and 118c, respectively.

Final processing then proceeds in accordance with integrated circuit fabrication techniques well know to those skilled in the art.

Figure 1F:
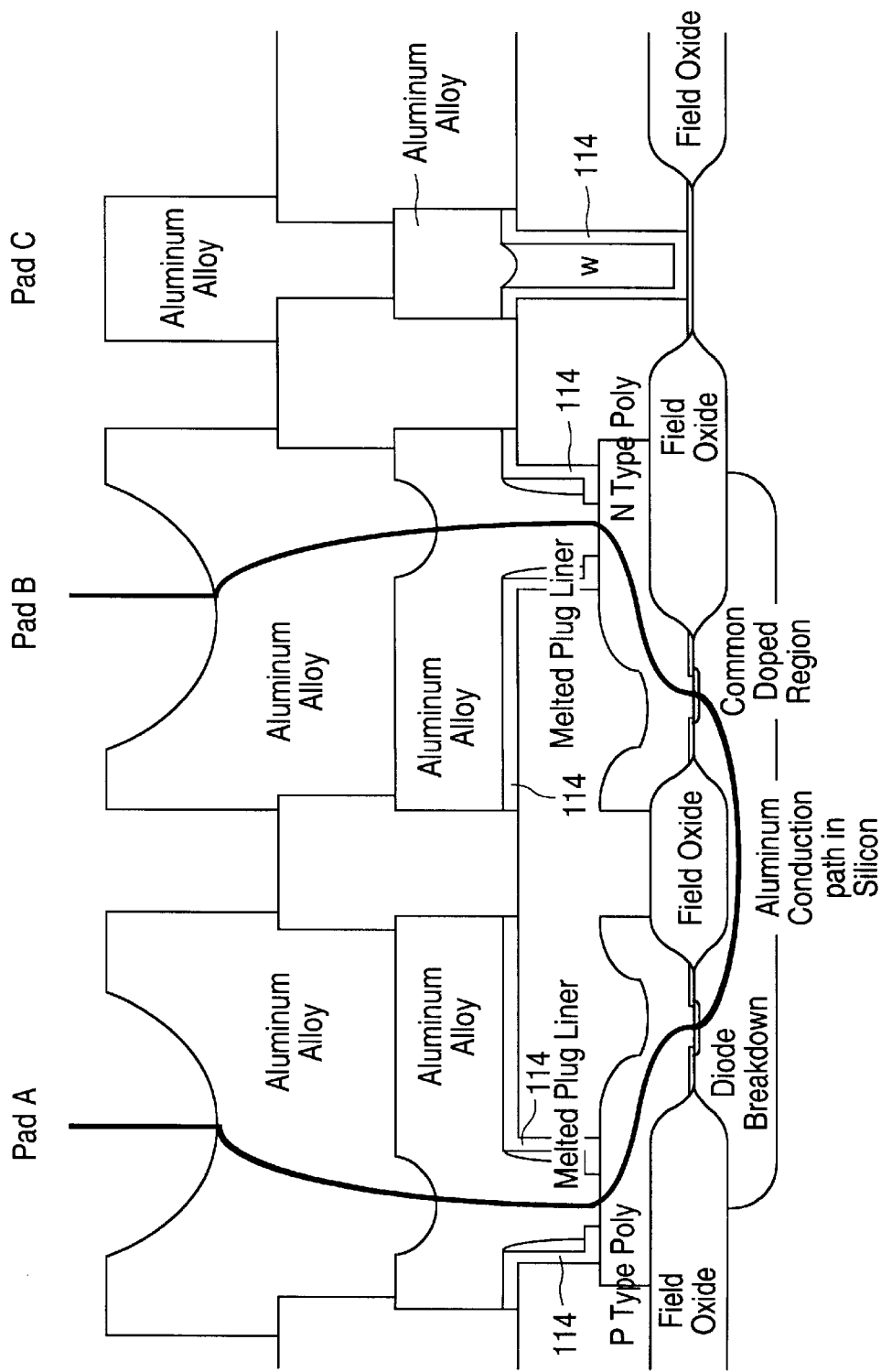

Referring to FIG. 1F, after final processing is completed, a trim procedure in accordance with the present invention can be accomplished as follows. First, the Zener zap diode between Pad A and Pad B is reverse biased and voltage is ramped until breakdown of the diode junction occurs. Sufficient current flow is then provided through Pads A and B to melt the plug liner 114 in contact areas 100a and 100b and flow the aluminum alloy between the two terminals. This forms a permanent anti-fuse path in the silicon and completes a conductive path between Pad A and Pad B.

Given the above detailed description of the invention and the embodiments of the invention described therein, it is intended that the following claims define the scope of the invention and that structures and methods within the scope of these claims and their equivalents be covered thereby.

What is claimed is:

1. A method of forming a Zener Zap diode aluminum bridge anti-fuse in a Tungsten plug process, the method comprising:

forming an integrated circuit device structure that includes a doped region formed in a silicon substrate, first and second spaced-apart contact regions formed on a surface of the doped region, each contact region having a layer of gate dielectric material formed thereon, the gate dielectric material being opened prior to formation of first and second polysilicon regions such that the first and second polysilicon regions are formed over the gate dielectric material but in contact with the first and second contact regions, a layer of insulating dielectric material formed over the first and second polysilicon regions, the layer of insulating dielectric material having first and second oversized contact openings formed therein to respectively expose a surface region the first and second polysilicon regions, conductive plug liner material formed on exposed surfaces of the first and second polysilicon regions, and first and second spaced-apart, electrically-insulated aluminum/aluminum alloy oversized contacts formed in electrical contact with the plug liner material formed in the first and second oversized contact openings;

applying reverse bias voltage to the first and second aluminum/aluminum alloy contacts suuficient to cause diode junction breakdown; and providing sufficient current flow between the first and second aluminum/aluminum alloy oversized contacts to melt the plug liner material in the first and second polysilicon regions, thereby flowing the aluminum/aluminum alloy between the first and second aluminum/aluminum alloy oversized contacts and forming a permanent anti-fuse conduction path in the silicon substrate and between the first and second aluminum/aluminum alloy oversized contacts.

2. A method as in claim 1, and wherein the plug liner material comprises titanium nitride (TiN).

3. A method as in claim 1, and wherein the gate dielectric material comprises silicon oxide.

4. A method as in claim 1, and wherein the insulating dielectric material comprises silicon dioxide.

5. A method as in claim 1, and wherein the conductive plug liner material formed in the first and second oversized contact openings has residual Tungsten, side-wall spacer material formed thereon.

6. A Zener zap diode aluminum bridge anti-fuse structure, the structure comprising;

a doped region formed in a silicon substrate;

first and second spaced-apart contact regions formed on a surface of the doped region, each contact region having a layer of gate dielectric material formed thereon, the gate dielectric material being open to expose a surface portion of the respective contact region;

first and second polysilicon regions formed over the first and second gate dielectric material, respectively, and in contact with the exposed surface regions of the respective first and second contact regions;

a layer of insulating dielectric material formed over the first and second polysilicon regions, the layer of insulating dielectric material having first and second oversized contact openings formed therein to respectively expose a surface region of the first and second polysilicon regions;

conductive plug liner material formed on the exposed surface regions of the first and second polysilicon regions; and first and second spaced-apart electrically insulated aluminum/aluminum alloy oversized contacts formed in electrical contact with the plug liner material in the first and second oversized contact openings.

7. A structure as in claim 6, and wherein the plug liner material comprises titanium nitride (TiN).

8. A structure as in claim 6, and wherein the gate dielectric material comprises silicon oxide.

9. A structure as in claim 6, and wherein the insulating dielectric material comprises silicon dioxide.

10. A structure as in claim 6, and wherein the conductive plug liner material formed in the first and second oversized contact openings has residual Tungsten side-wall spacer material formed thereon.

* * * * *